United States Patent
Fey et al.

(10) Patent No.: US 6,867,594 B2
(45) Date of Patent: Mar. 15, 2005

(54) DEVICE FOR PRECISE CENTERING OF AN NMR SAMPLE TUBE

(75) Inventors: Michael Fey, Hornussen (CH); Marcel Urfer, Lenzburg (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/444,998

(22) Filed: May 27, 2003

(65) Prior Publication Data

US 2003/0231019 A1 Dec. 18, 2003

(30) Foreign Application Priority Data

Jun. 12, 2002 (DE) .......................................... 102 25 958

(51) Int. Cl.[7] ................................................. G01V 3/00
(52) U.S. Cl. ..................................................... 324/321
(58) Field of Search ................................ 324/307, 309, 324/321

(56) References Cited

U.S. PATENT DOCUMENTS

| | | | |
|---|---|---|---|
| 4,517,516 A | | 5/1985 | Hill |
| 5,247,256 A | * | 9/1993 | Marek .......................... 324/321 |
| 5,517,856 A | | 5/1996 | Hofmann |
| 5,689,187 A | * | 11/1997 | Marek et al. ................. 324/318 |
| 5,867,026 A | * | 2/1999 | Haner .......................... 324/321 |
| 5,977,772 A | * | 11/1999 | Wand et al. .................. 324/321 |
| 6,198,281 B1 | * | 3/2001 | Wand et al. .................. 324/300 |
| 6,204,665 B1 | * | 3/2001 | Triebe et al. ................. 324/318 |
| 6,310,480 B1 | * | 10/2001 | Cohen et al. ................. 324/321 |
| 6,329,820 B1 | * | 12/2001 | Hasegawa et al. ............ 324/315 |
| 6,362,624 B1 | * | 3/2002 | Wand et al. .................. 324/321 |
| 6,437,570 B2 | * | 8/2002 | Marek .......................... 324/321 |
| 6,441,617 B2 | * | 8/2002 | Marek .......................... 324/318 |
| 6,466,019 B2 | | 10/2002 | Marek |
| 6,486,672 B1 | * | 11/2002 | Wand et al. .................. 324/321 |
| 6,507,191 B1 | * | 1/2003 | Eguchi et al. ................ 324/318 |
| 6,686,740 B2 | * | 2/2004 | Tschirky et al. .............. 324/321 |
| 2002/0135372 A1 | | 9/2002 | Warden |
| 2002/0196022 A1 | | 12/2002 | Tschirky |

FOREIGN PATENT DOCUMENTS

| | | |
|---|---|---|
| DE | 195 09 062 | 11/1995 |
| EP | 1 239 296 | 9/2002 |
| JP | 05 026 995 | 2/1993 |

OTHER PUBLICATIONS

"High Resolution NMR, Probeheads", Bruker Group, 1995.

* cited by examiner

*Primary Examiner*—Christopher W. Fulton
*Assistant Examiner*—Dixomara Vargas
(74) *Attorney, Agent, or Firm*—Paul Vincent

(57) ABSTRACT

A device for centering an elongated sample tube (8), filled with a measuring substance, relative to a vertical axis of a nuclear magnetic resonance (NMR) receiver coil system (9) which is rigidly mounted in a support device is characterized in that at least two centering means are provided which are mutually separated in an axial direction of the receiver coil axis and act exclusively in a radial direction on the sample tube (8), one of which is disposed in the upper region (9a) and the other in the lower region (9b, 9b') of the NMR receiver coil system (9a–k) and with at least one positioning means acting on the sample tube (8) in an exclusively axial direction which may be located either below (20a) or above (17) the NMR receiver coil system, wherein the exclusively radially acting centering means (9a, 9b, 9b') are components of the NMR receiver coil system (9a–k). The centering accuracy can be increased compared to known devices to obtain optimum results even for sample tubes in the form of measuring capillaries which pose the highest requirements with respect to centering accuracy.

11 Claims, 8 Drawing Sheets

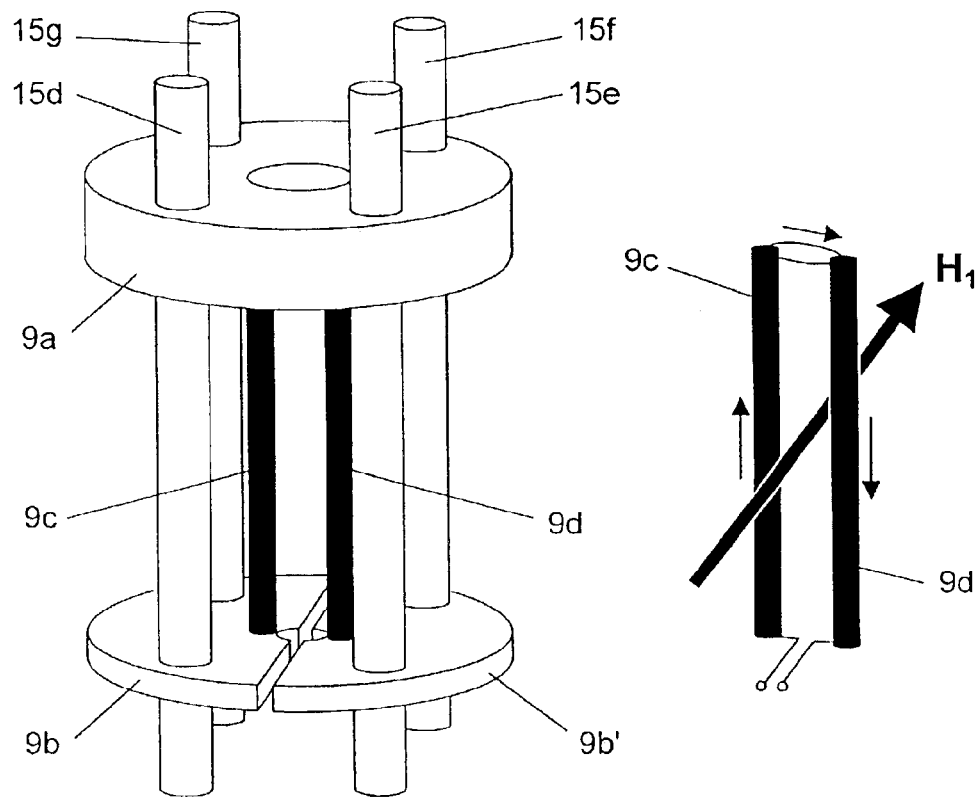
Fig. 8a                     Fig. 8b
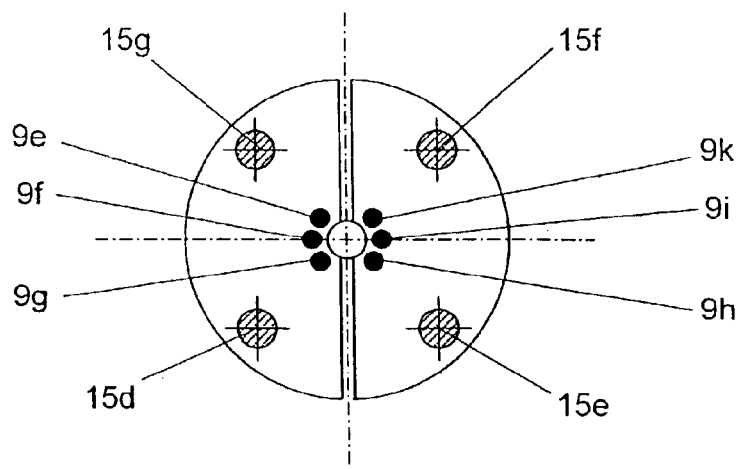
Fig. 9

DEVICE FOR PRECISE CENTERING OF AN NMR SAMPLE TUBE

This application claims Paris Convention priority of DE 102 25 958.5 filed Jun. 12, 2002 the complete disclosure of which is hereby incorporated by reference.

BACKGROUND OF THE INVENTION

The invention concerns a device for centering an elongated sample tube, which is filled with a measuring substance, relative to a vertical axis of a nuclear magnetic resonance (NMR) receiver coil system which is rigidly mounted in a support device.

A device of this type is known from the company leaflet "High Resolution NMR, Probeheads" of the Bruker group, dated 1995.

Exact centering of a sample tube relative to the transmitter and receiver coil is an important prerequisite in NMR spectroscopy to obtain maximum spectrometer sensitivity. Radial centering must be particularly precise since the separation between the receiver coil system and the sample tube must be as small as possible to obtain a maximum fill factor. With increasingly smaller sample tubes, the separation between the receiver coil system and the sample tube must decrease linearly to maintain the same fill factor and the requirements for radial positioning accuracy therefore also increase linearly. In the limiting case, if the sample tube consists of a so-called measuring capillary, the requirements for the radial centering accuracy are extremely high. Such measuring capillaries are mainly used when the available amount of measuring substance is very small.

Conventional centering devices can be classified into different accuracy levels in dependence on the design:

Accuracy level 1 is the lowest level of centering accuracy. The above-mentioned company leaflet of Bruker AG discloses e.g. an arrangement as shown in FIG. 1, whereby the sample tube 8 is inserted into the rotor 7a of an air turbine (spinner). This spinner is axially and radially centered on the conical guiding surface of the stator 2a of the air turbine located above the receiver coil system 9. The stator, with its conical guiding surface, is not directly mechanically connected to the receiver coil system but is indirectly connected to the upper and lower mounting 11, 12 of the support tube 10 of the receiver coil system 9 first via a lower support part 3, a lower part of the probe head 4, and then via the upper part 5 of the probe head. The position of the sample tube relative to the receiver coil system therefore depends on a plurality of individual parts having different mechanical tolerances which may add in the worst case thereby impairing the accuracy and reproducibility of the centering process.

In particular, it must be mentioned that the distance between the conical guiding surface and the receiver coil system is relatively large. Consequently, the slightest angular orientation error in the axis of the conical guiding surface has a large influence on the position of the sample tube at the location of the receiver coil. This influence increases with increasing separation between the conical guiding surface and the receiver coil system.

FIG. 2 shows a device with the next higher accuracy level 2. It permits more precise centering of the sample tube than the device of FIG. 1. The sample tube is also inserted into a spinner 7a which is positioned in an axial and radial direction through the conical guiding surface of the stator 2b of an air turbine located above the receiver coil system 9. In contrast to the arrangement of FIG. 1, the stator is thereby mounted, with its conical guiding surface, directly to the upper part 5 of the probe head. The conical guiding surface is thereby connected to the receiver coil system via less intermediate parts thereby reducing the number of possibly adding mechanical tolerances. As in FIG. 1, the separation between the conical guiding surface and the receiver coil system is still large such that angular errors in the orientation of the conical guiding surface can also produce large positioning errors in this case.

U.S. Pat. No. 6,466,019 B2 describes a device with an even higher accuracy level 3. The sample tube is thereby also inserted into a spinner which is positioned in an axial and radial direction via the conical guiding surface of the stator of an air turbine which is located above the receiver coil system. Similar to FIG. 1, the conical guiding surface is not directly connected to the upper part of the probe head, rather indirectly via various support parts. An important additional feature of the device is a second radial centering mechanism which is mounted directly below the receiver coil system. This nearly eliminates the influence of angular error in the conical guiding surface, despite the fact that the distance between conical guiding surface and receiver coil system is similar to the arrangements of FIGS. 1 and 2.

In contrast thereto, it is the underlying purpose of the present invention to further increase the centering accuracy compared to the above-described known devices using as simple as possible technical means to obtain optimum results, even for sample tubes in the form of measuring capillaries requiring the highest centering precision.

SUMMARY OF THE INVENTION

This object is achieved in accordance with the invention in a surprisingly simple and effective fashion in that at least two centering means are provided which are mutually separated in an axial direction of the receiver coil axis and act on the sample tube in an exclusively radial direction, one of which is disposed at the upper end and the other at the lower end of the receiver coil system and with at least one positioning means which acts on the sample tube in an exclusively axial direction which may be located either below or above the NMR receiver coil system, wherein the centering means which act in an exclusively radial direction are themselves parts of the NMR receiver coil system.

The two axially separated and exclusively radially acting centering means ensure optimum radial centering of the sample tube even when it has a very small diameter, as is the case with conventional measuring capillaries which are used when very small substance amounts are to be examined. The inventive rigid mechanical connection between the two radially acting centering means and the NMR receiver coil system ensures that the sample tube is necessarily radially centered relative to the NMR receiver coil system. In addition and independent thereof, axial centering is also provided to ensure a very high overall centering accuracy. The separation of the individual centering functions also permits particularly high degrees of freedom in the geometrical design for the overall centering device, with the centering being effected geometrically, directly at the receiver coil system.

A similar device having radial centering means which do not form part of the NMR receiver coil system but which are disposed above and below same, is described in US patent publication number US 2002/0 135 372 A1. FIGS. 3 and 4 show two variants of this device.

Since the NMR receiver coil system 9 of FIGS. 3 and 4 can have an outer diameter of only 1 to 2 mm in the extreme case, it is very tedious to mount to the inside of the support bars 15a–c. Moreover, the NMR receiver coil system 9 has a low intrinsic mechanical stability since it is formed from a thin conducting metal sheet in the shape of a saddle coil. Minimum mechanical disturbances or air currents can excite mechanical vibrations in this receiver coil system thereby producing disturbances in the NMR spectrum.

The inventive device is particularly useful for these extreme cases having such small dimensions and permits increased intrinsic stability of the NMR receiver coil system while making it easier to produce and mount. This is the case since the NMR receiver coil system does not comprise a metallic foil but rather stable, individual parts which can be interconnected in a relatively simple fashion.

One particularly simple embodiment of the inventive device is characterized in that the positioning means which acts on the sample tube in an exclusively axial direction is disposed below the NMR receiver coil system and comprises a stop part on which the sample tube is supported in the operating position. The sample tube is thereby axially centered in a highly simple, but precise manner.

In an alternative further preferred embodiment of the inventive device, the positioning means which acts on the sample tube in an exclusively axial direction is disposed above the NMR receiver coil system and comprises a mounting sleeve which is secured against slippage and radially disposed about the sample tube in a collar-like manner which, in the operating position of the sample tube, is flatly supported on a horizontal terminating surface of a horizontal stop surface disposed above the NMR receiver coil system. This embodiment is technically more demanding than that described above, but substantially facilitates handling of the system during operation.

In a particularly advantageous further development of this embodiment, the stop surface for the mounting sleeve is provided in the bottom region on the inside of a rotor which is part of an air turbine for positioning and optionally rotating the sample tube and which has a central inner axial bore having a diameter which is larger than the outer diameter of the mounting sleeve. The outer dimensions of the air turbine may coincide with those of known conventional spinners such that the system is automatically adapted to already existing pneumatic means and changes to those parts of the apparatus are not required.

The mounting sleeve of these embodiments may be securely mounted to the sample tube through strong frictional contact. It may also be fixed to the sample tube, in particular glued or welded to preclude displacement of the mounting sleeve when its horizontal terminating surface abuts the associated stop surface.

A preferred embodiment of the invention is characterized in that the two centering means which act on the sample tube in an exclusively radial direction and which, at the same time, are part of the NMR receiver coil system are designed such that the electrically conducting disc of the upper centering means is electrically connected to the upper part of the conductor parts of the NMR receiver coil system oriented in an axial direction of the receiver coil axis, and the two electrically conducting semi-discs of the lower centering means are electrically connected to the lower part of the conductor parts of the NMR receiver coil system oriented in an axial direction of the receiver coil axis to form the two connecting elements of the NMR receiver coil system.

The centering means are preferably mounted to electrically insulating support bars which are disposed symmetrically around the sample tube.

Preferably, exactly four support bars are provided.

The support bars should in any case be produced from an electrically insulating material which has no effect on the NMR measurements. The support bars are preferably made from ceramic, glass or quartz material.

Further advantages of the invention can be extracted from the description and the drawing. The features mentioned above and below may be used in accordance with the invention either individually or collectively in any arbitrary combination. The embodiments shown and described are not to be understood as exhaustive enumeration, rather have exemplary character for describing the invention.

The invention is shown in the drawing and explained in more detail with reference to embodiments.

BRIEF DESCRIPTION OF THE DRAWING

FIG. 7b shows a horizontal section along the line A—A' of FIG. 7a;

FIG. 8a shows a three-dimensional illustration of the first above-mentioned inventive embodiment wherein the construction parts 9a, 9b and 9b' are components of the receiver coil system and, at the same time, radially center the sample tube;

FIG. 8b shows a simplified three-dimensional illustration of the function of the NMR receiver coil system of FIG. 8a wherein H1 is the high-frequency field which is generated by the high-frequency current in the receiver coil system and which excites the spins in the sample tube, wherein the small arrows indicate the direction of the high-frequency current; and FIG. 9 shows a horizontal section, analog to FIG. 7b, of the second inventive embodiment, wherein the NMR receiver coil system contains three individual longitudinal conductors 9e, f, g and 9h, i, k instead of the two individual longitudinal conductors 9c and 9d.

DESCRIPTION OF THE PREFERRED EMBODIMENT

Figure 3:
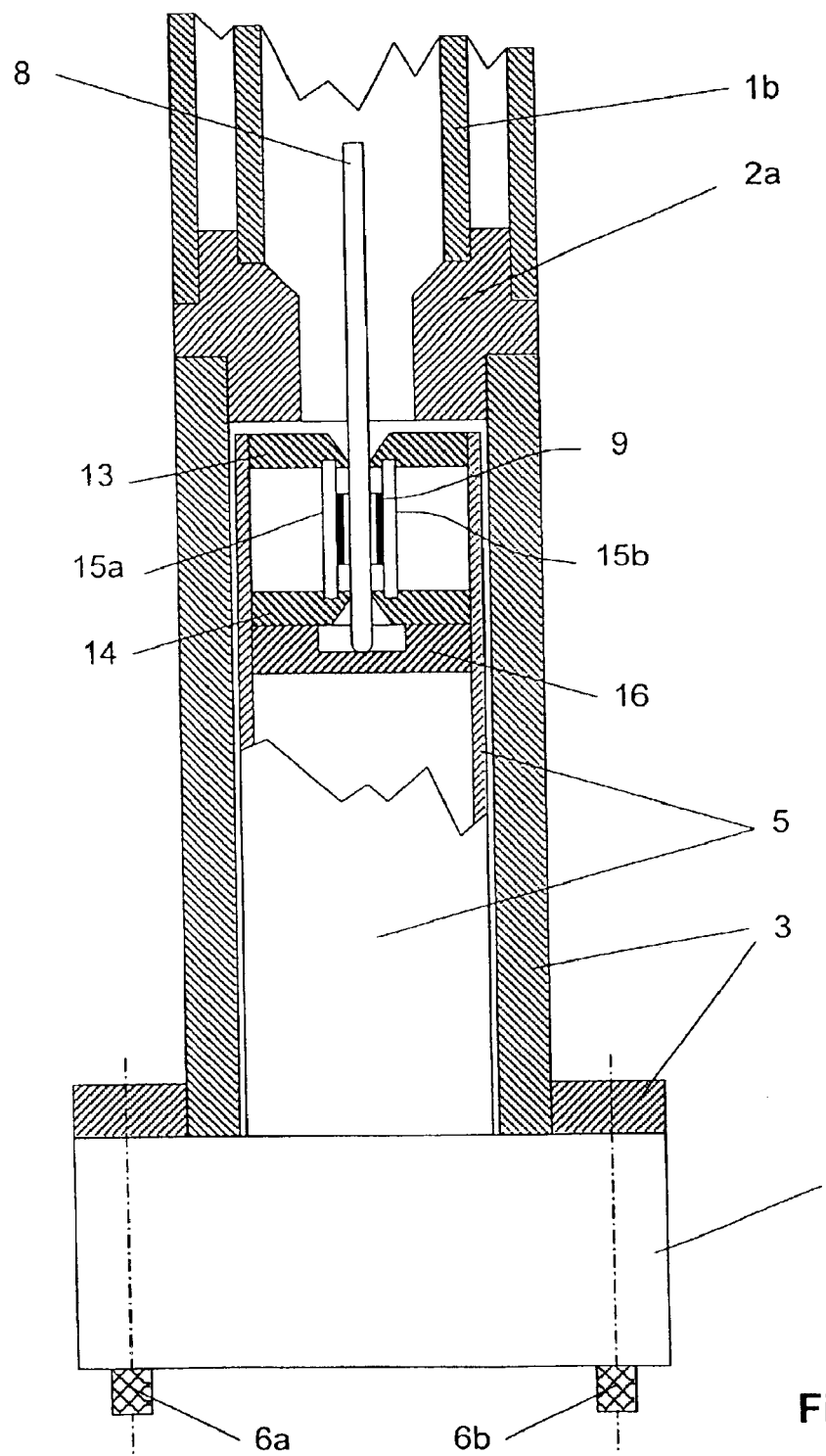
FIG. 3 shows a schematic vertical section through an NMR probe head in accordance with US patent publication number US 2002/0 135 372 A1 without spinner and with lower axial stop for the sample tube.

In accordance with US patent publication number US 2002/0 135 372 A1, the sample tube is purely radially centered directly above and below the receiver coil system by means of the two centering devices 13 and 14 (FIG. 3). Since this centering is effected as close to the NMR receiver coil system 9 as possible and with a minimum amount of intermediate parts, high centering accuracy is guaranteed. The possible proximity of the centering mounting to the receiver coil system depends on the influence of the susceptibility of the materials used on the NMR resolution. This can be determined experimentally.

Since the device in accordance with US patent publication number US 2002/0 135 372 A1 achieves high radial centering accuracy, the receiver coil system 9 can be mounted inside of its support device, i.e. directly around the sample tube 8 and with a very small mutual separation, thereby obtaining a very high fill factor. The prerequisite for such an arrangement is the high radial centering accuracy which prevents damage to the receiver coil system 9 during insertion of the sample tube.

The inventive device requires no separate radial centering device since it (9a, 9b, 9b') is part of the NMR receiver coil system. The sample tube is radially centered by the upper (9a) and lower (9b, 9b') part of the receiver coil system thereby directly mutually centering the two most sensitive components of the inventive device, i.e. the receiver coil system and the sample tube, with the highest possible degree of accuracy.

To obtain a maximum fill factor for the NMR receiver coil system of the inventive device, the main conductors of the receiver coil system 9c, d or 9e, f, g, h, i, k which are mechanically and electrically connected to the radial centering device, are disposed as closely about the sample tube as possible. Since the accuracy of radial centering is particularly high and since the main conductors are also highly mechanically stable and therefore robust, they can be disposed very closely to the sample tube (FIG. 7b, FIG. 9). This automatically produces a particularly high fill factor.

Figure 7A:
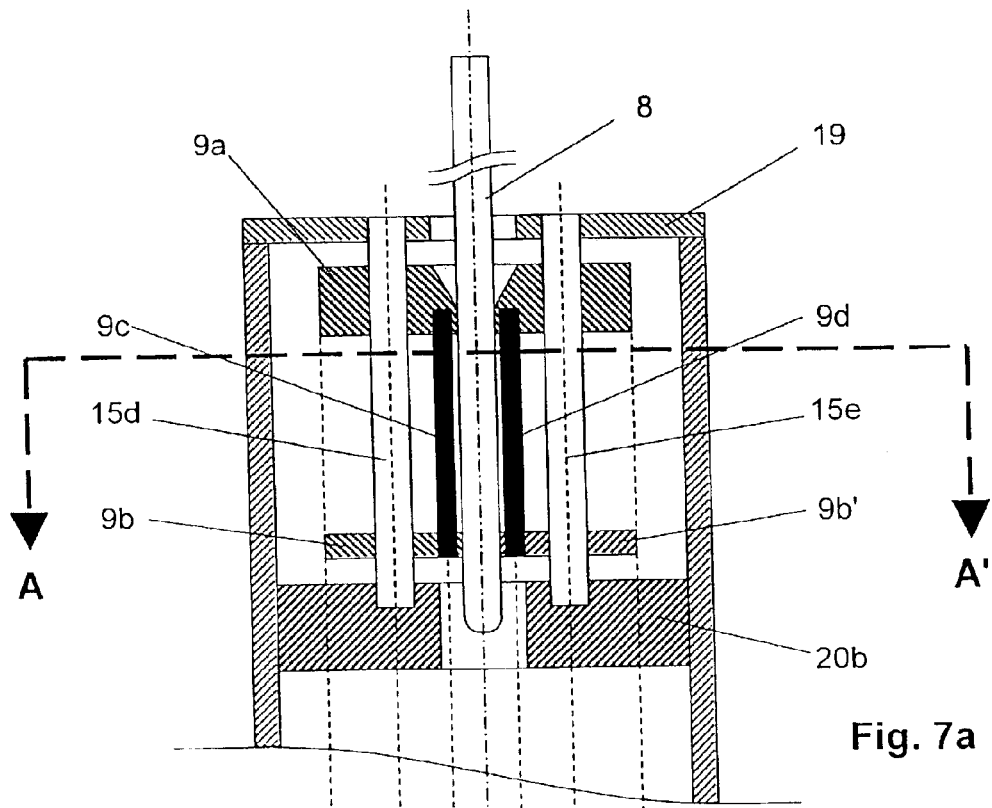
FIG. 7a shows the region about the NMR receiver coil system of a device in accordance with FIG. 6 in more detail.
Figure 7B:
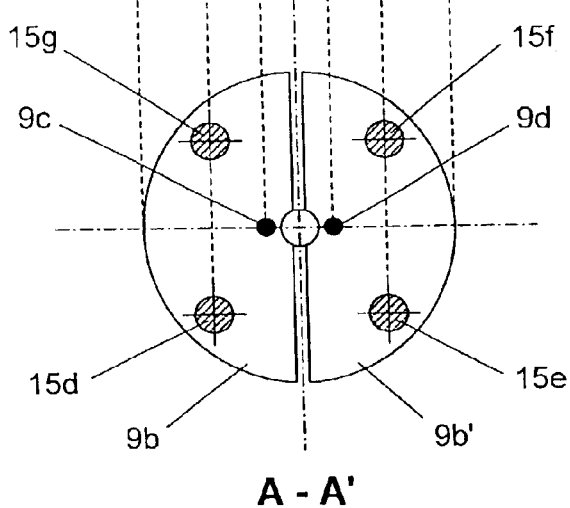

In a first variant (FIGS. 7a, b; FIG. 8a) of the inventive device, the NMR receiver coil system has only two main conductors 9c, d. This variant is characterized by simple production and mounting. The NMR receiver coil system consists of five individual parts, namely two main conductors 9c, d which are oriented parallel to the axis of the receiver coil system, one electrically conducting disc 9a in which the upper parts of the two main conductors are inserted and thereby electrically connected and two electrically conducting semi-discs 9b, 9b' into which the lower part of each of the two main conductors is inserted and thereby electrically connected to the associated semi-disc. The individual disc and the two semi-discs are relatively large and stable and are mechanically mutually rigidly fixed relative to the probe head 19, 20a, 20b by means of preferably four electrically insulating support bars 15d–g. The support bars 15d–g are preferably made from ceramic, glass or quartz material. The disc 9a and the two semi-discs 9b, 9b' are designed such that they also act as radial centering means and thereby ideally provide the required rigid connection between the centering means and NMR receiver coil system.

In a second variant (FIG. 9) of the inventive device, the two main conductors 9c, 9d are replaced by three main conductors 9e, f, g and 9h, i, k which are also oriented parallel to the axis of the NMR receiver coil system. The overall NMR receiver coil system therefore consists of nine individual parts 9a, b, b', e, f, g, h, i, k and advantageously has a larger Q-value compared to the first variant, a larger fill factor and a more homogeneous $H_1$ field.

This significantly improves the high-frequency properties of the NMR receiver coil system. First of all, the overall surface of the main conductors per unit length is increased thereby reducing its high-frequency resistance and increasing its Q-value. Secondly, the distribution of the main conductors over a larger peripheral region of the sample tube improves the homogeneity of the H1 field in a radial direction and produces a higher fill factor since the main conductors surround the sample tube over a larger angular region.

It should be noted that the two above-described embodiments of the inventive device have the property that the respectively associated NMR receiver coil system acts not only as a high-frequency resonator but also and simultaneously as a radial centering means.

Figure 5:
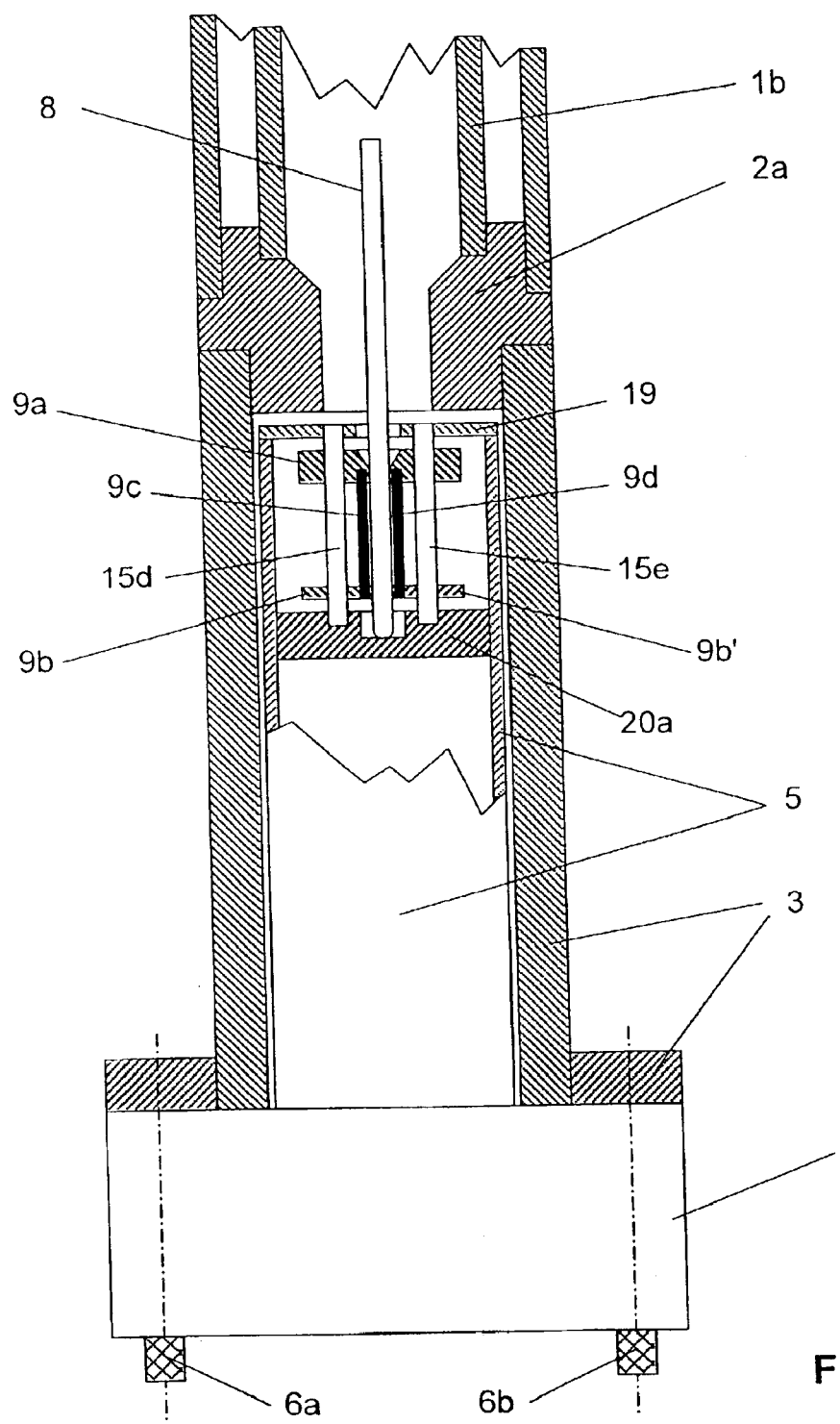
FIG. 5 shows a schematic vertical section through an embodiment of the inventive NMR probe head without spinner and with lower axial stop of the sample tube.
Figure 6:
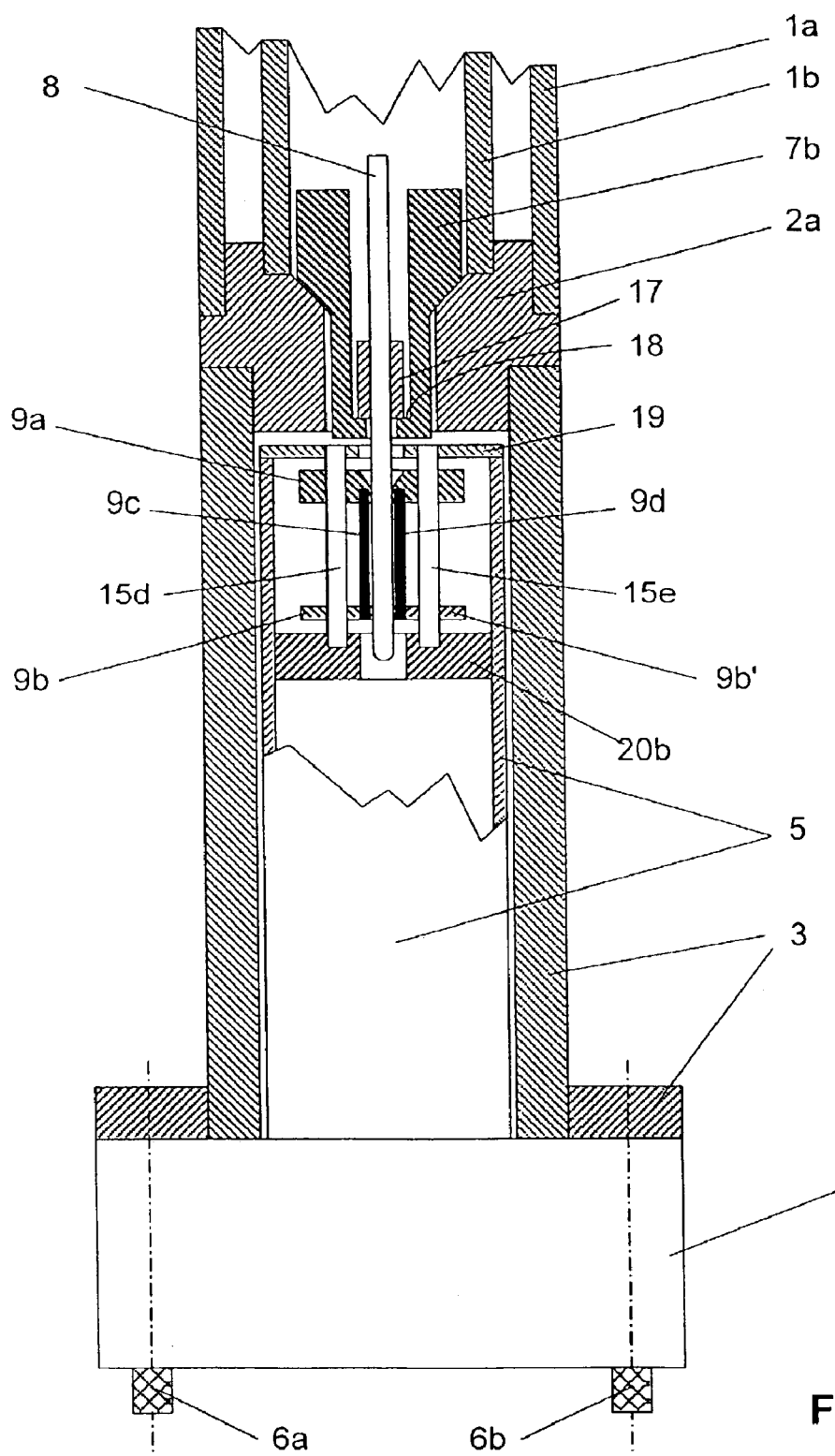
FIG. 6 shows a schematic vertical section through a further embodiment of the inventive NMR probe head with modified spinner and mounting sleeve for axial positioning of the sample tube.

Axial positioning is effected separately, either below the NMR receiver coil system 9a, b, b', c, d, or 9a, b, b', e–k by means of a stop part 20a (FIG. 5) or above the NMR receiver coil system, preferably within a modified spinner 7b, by means of a mounting sleeve 17 (FIG. 6).

FIG. 5 shows a variant of the inventive device wherein the sample tube is axially positioned below the receiver coil system by means of the stop part 20a. This variant is advantageously simple but has the disadvantage that insertion of the sample tube 8 is difficult. Insertion from above is only possible with an auxiliary device, since the guiding tube 1b of the spinner is relatively long. It is also possible to remove the probe head 4, 5 at first through releasing the screws 6a, 6b, then insert the sample tube 8 into the probe head and finally re-mount the probe head with the screws 6a, 6b.

FIG. 6 shows axial positioning of the sample tube 8 by means of a slightly modified spinner which is located above the receiver coil system. This solution is somewhat more demanding but has very important advantages which are explained below. The sample tube 8 is initially tightly inserted into a mounting sleeve 17. The sleeve 17 may also be permanently glued or welded to the sample tube 8.

The upper region of the spinner 7b has an enlarged bore for loosely receiving the mounting sleeve 17, i.e. with sufficient play in the radial direction. The narrowing in the lower region of the spinner has a stop surface 18 on which the mounting sleeve 17 is supported to produce axial centering.

The spinner 7b whose outer dimensions correspond to those of conventional spinners is adapted to existing pneumatics with which it can be transported, supported on an air cushion, from an upward location downwardly through the guiding tube 1b and vice versa from a lower location back upwards. Since the mounting sleeve 17 can freely move upwardly and, to a limited degree, also laterally within the spinner 7b, the fragile measuring capillary can abut against the conical part of the upper centering device 9a and safely center itself at this location whereas the spinner continues downwardly past the capillary without carrying the capillary along therewith and thereby subjecting it to additional forces via the relatively large weight of the spinner which could break the capillary. Because there is no rigid connection between the mounting sleeve 17 and the spinner 7b, the measuring capillary can safely abut the conical part of the centering device 9a and be centered at that location while the spinner 7b moves downwardly past it without carrying along the mounting sleeve 17 to thereby avoid exerting additional forces on the measuring capillary.

It should be emphasized here that conventional use of the pneumatic means for lowering the spinner including measuring capillary often caused glass breakage. The inventive design of the spinner 7b immediately eliminated these problems.

Figure 1:
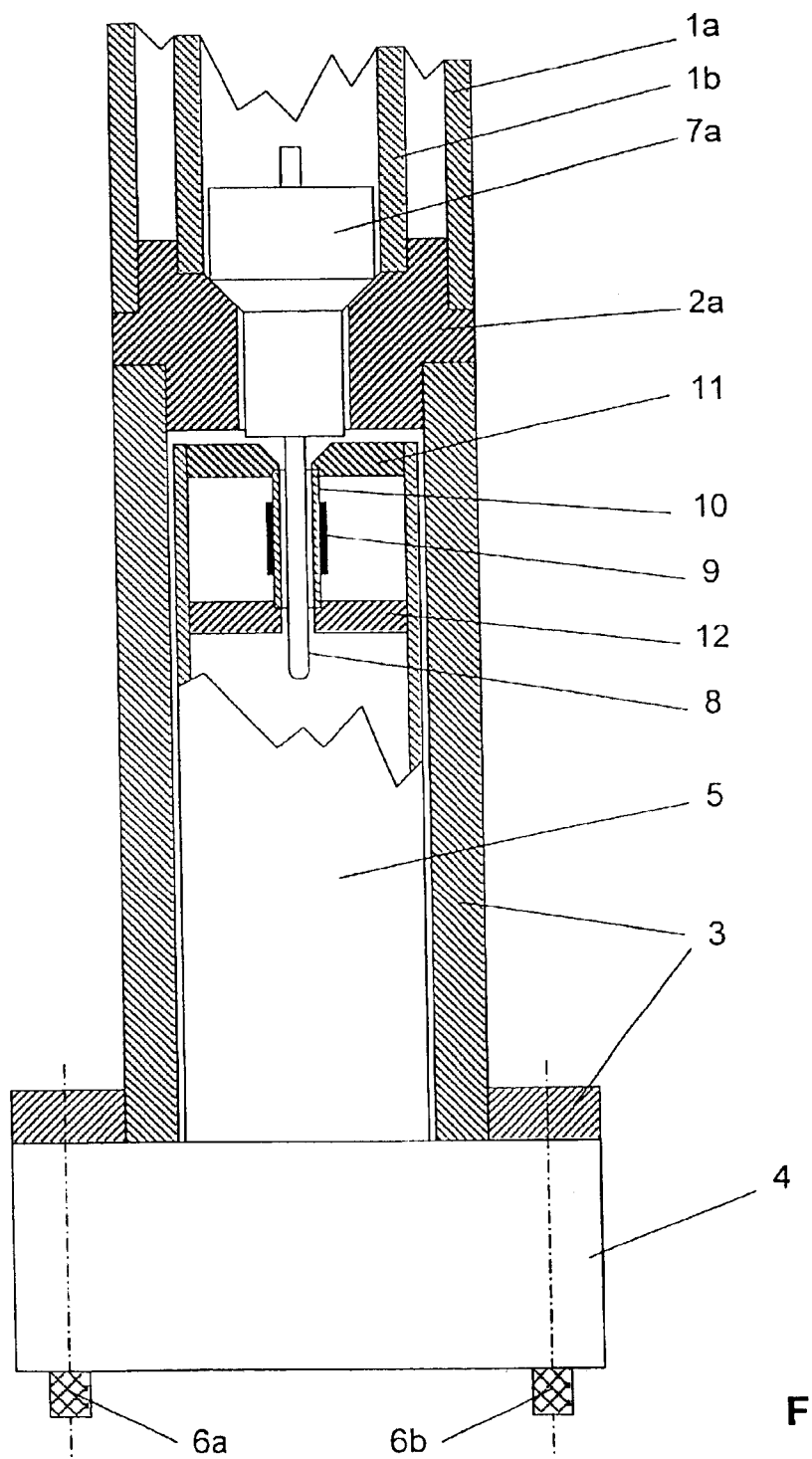
FIG. 1 shows a schematic vertical section through an NMR probe head according to prior art with accuracy level 1 sample tube centering.
Figure 2:
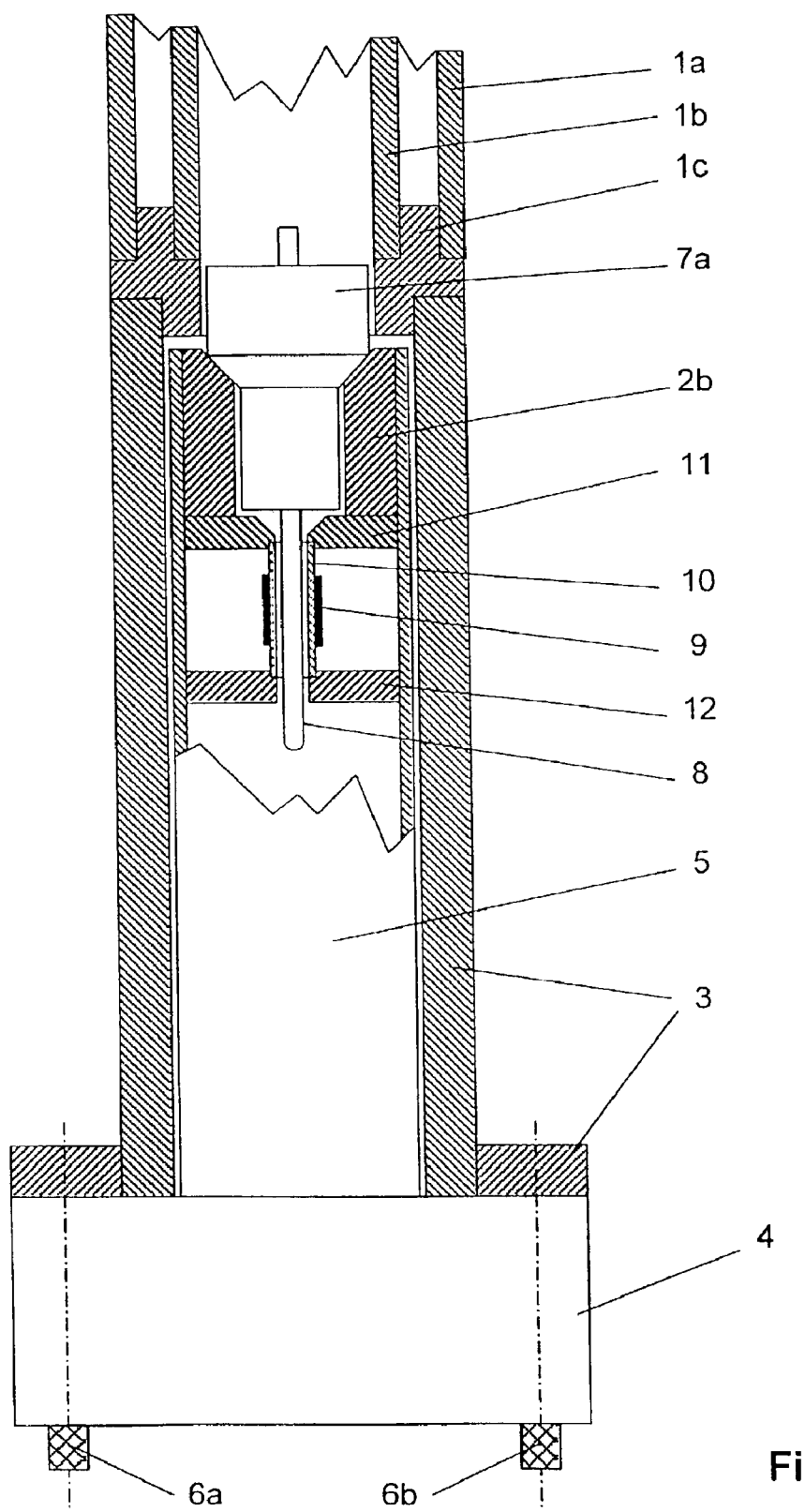
FIG. 2 shows a schematic vertical section through an NMR probe head according to prior art with accuracy level 2 sample tube centering.
Figure 4:
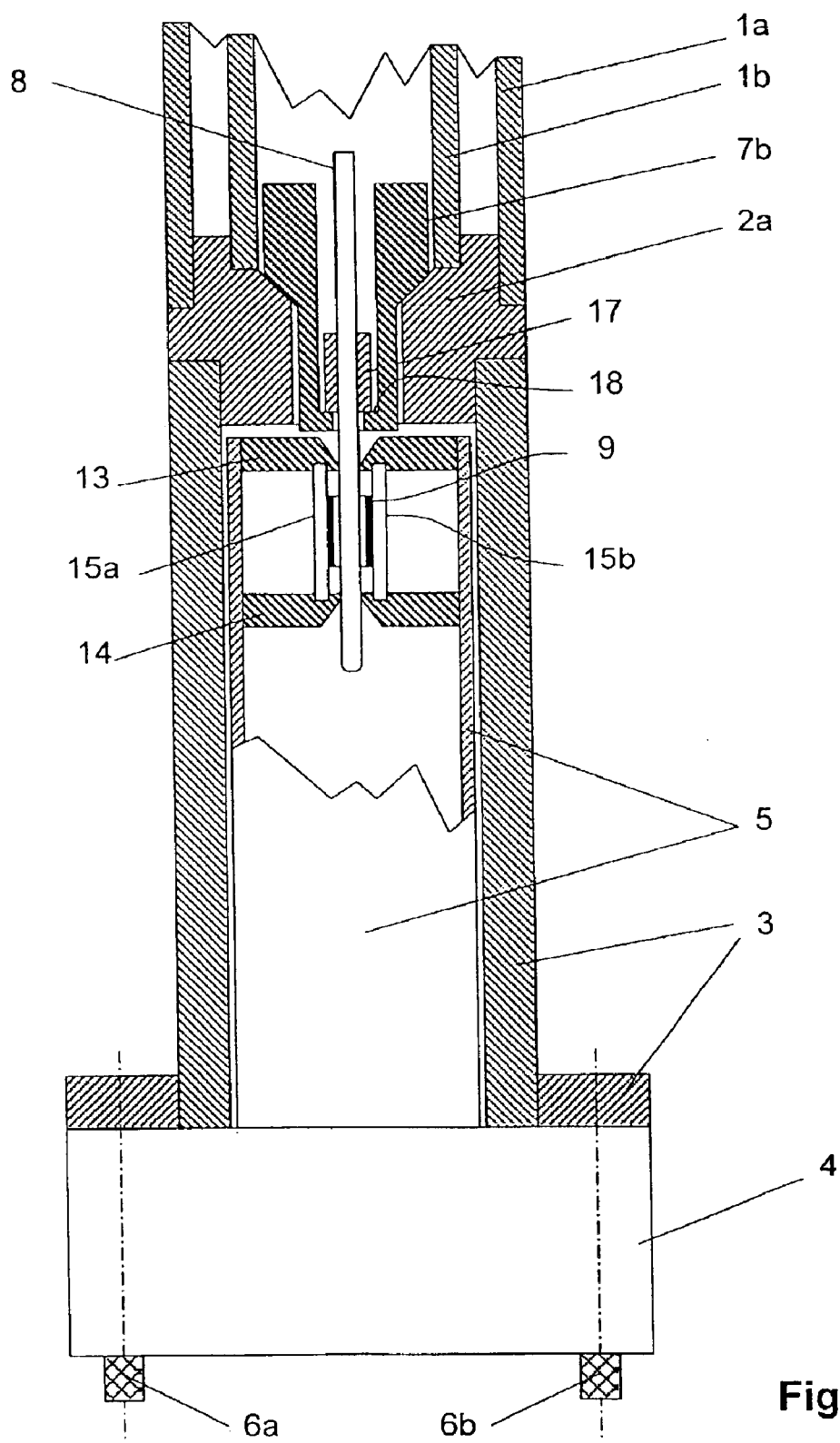
FIG. 4 shows a schematic vertical section through an NMR probe head in accordance with US patent publication number US 2002/0 135 372 A1 with modified spinner and with mounting sleeve for axial positioning of the sample tube.

List of Reference Numerals 1a upper support part (outer shell).
1b upper support part (guiding tube for the spinner).
1c upper support part (lower terminating flange).
2a stator of the air turbine of FIG. 1, FIG. 3 and FIG. 4.
2b stator of the air turbine of FIG. 2.
3 lower support part.
4 lower part of the probe head.
5 upper part of the probe head.
6a, b mounting screws. They can be unscrewed by hand to facilitate removal of the probe head.
7a rotor (spinner) of the air turbine of FIGS. 1 and 2.
7b rotor (spinner) of the air turbine of FIG. 4. It simultaneously permits purely axial positioning of the sample tube 8.
8 sample tube which contains the substance to be measured.
9 receiver coil system which belongs to prior art. It consists of a thin conducting foil and preferably has a saddle-shaped design.
9a upper radially acting centering device which belongs to the first variant of the inventive embodiment and which is electrically conducting and forms at the same time part of the receiver coil system. It assumes the function of the upper electrical transverse connection of the receiver coil system.
9b,b' lower radially acting centering device which belongs to the first variant of the inventive embodiment which is electrically conducting and at the same time forms part of the receiver coil system. It is constructed of two parts and provides the connecting points of the receiver coil system.
9c,d the two main conductors of the NMR receiver coil system which belongs to the first variant of the inventive embodiment. Both main conductors are oriented parallel to the receiver coil axis and substantially generate the high-frequency field $H_1$.
9e–g the first group of three main conductors of the NMR receiver coil system which belongs to the second variant of the inventive embodiment. The three conductors replace the single conductor 9c of the first variant.
9h–k the second group of three main conductors of the NMR receiver coil system which belongs to the second variant of the inventive embodiment. The three conductors replace the single conductor 9d of the first variant.
10 support tube for mounting the receiver coil system in accordance with prior art.
11 upper mounting part of the support tube 10 in accordance with prior art.
12 lower mounting part of the support tube 10 in accordance with prior art.
13 upper radially acting centering device in accordance with German patent application number 101 11 672.1-33. It simultaneously serves as upper mounting of the three support bars 15a, 15b and 15c of the receiver coil system 9.
14 lower radially acting centering device according to German patent application number 101 11 672.1-33. It simultaneously serves as lower mounting of the three support bars 15a, 15b and 15c of the receiver coil system 9.
15a–c three electrically insulating support bars in accordance with German patent application number 101 11 672.1-33. They are provided for mounting the receiver coil system 9.
15a–g four electrically insulating support bars which belong to the inventive embodiments. They serve for mounting the first (9a, b, b', c, d) or second (9a, b, b', e, f, g, h, I, k) variant of the NMR receiver coil system.
16 stop part for axial positioning of the sample tube.
17 mounting sleeve of the sample tube. It permits axial positioning of the sample tube in the spinner.
18 stop surface for the mounting sleeve 17. The stop surface serves for axial positioning of the sample tube.
19 upper mounting part of the NMR receiver coil system which belongs to the inventive embodiment.
20a lower mounting part of the NMR receiver coil system which belongs to the inventive embodiments. This mounting part has an additional stop surface for axial positioning of the sample tube.
20b lower mounting part of the NMR receiver coil system which belongs to the inventive embodiments. This mounting part has a hole instead of the axial positioning device.

We claim:

1. A device for centering an elongated sample tube, filled with a measuring substance, relative to a vertical axis of a nuclear magnetic resonance (NMR) receiver coil system which is rigidly mounted in a support device, the centering device comprising:
   at least one positioning means, said positioning means acting on the sample tube exclusively in an axial direction, said positioning means disposed either above or below the NMR receiver coil system;
   a first centering means disposed in an upper region of the NMR receiver coil system, said first centering means acting exclusively in a radial direction on the sample tube; and
   a second centering means disposed in a lower region of the NMR receiver coil system, said second centering means acting exclusively in a radial direction on the sample tube, said second centering means separated in an axial direction of the vertical receiver coil axis from said first centering means, wherein said first and said second centering means each comprise active electrical components of the NMR receiver coil system.

2. The device of claim 1, wherein said positioning means which exclusively acts on the sample tube in an axial direction is disposed below the NMR receiver coil system and comprises a stop part on which the sample tube is supported in an operating position.

3. The device of claim 1, wherein said positioning means which exclusively acts on the sample tube in an axial direction is disposed above the NMR receiver coil system and comprises a mounting sleeve which is disposed in a non-slipping manner radially about the sample tube in a collar-like fashion and which is flatly supported at a horizontal terminating surface of a horizontal stop surface disposed above the NMR receiver coil system in an operating position.

4. The device of claim 3, wherein said stop surface for said mounting sleeve is provided in a floor region on an inside of a rotor which is part of an air turbine for positioning and/or rotating the sample tube, the rotor having a central axial inner bore with a diameter which is larger than an outer diameter of said mounting sleeve.

5. The device of claim 3, wherein said mounting sleeve is rigidly connected to the sample tube.

6. The device of claim 5, wherein said mounting sleeve is glued to the sample tube.

7. The device of claim 5, wherein said mounting sleeve is welded to the sample tube.

8. The device of claim 1, wherein said first and said second centering means which act exclusively in a radial direction on the sample tube and which simultaneously belong to the NMR receiver coil system, are designed such that an electrically conducting disc of said first centering means is electrically connected to an upper portion of conductor parts of the NMR receiver coil system oriented in an axial direction of a receiver coil axis, wherein two electrically conducting semi-discs of said second centering means are electrically connected to a lower portion of the conductor parts of the NMR receiver coil system oriented in the axial direction of the receiver coil axis to thereby form two terminal elements of the NMR receiver coil system.

9. The device of claim 8, wherein said first and said second centering means are mounted to electrically insulating support bars which are disposed symmetrically around the sample tube.

10. The device of claim 9, wherein four support bars are provided.

11. The device of claim 9, wherein the electrically insulating support bars are made from ceramic, glass or quartz material.

* * * * *